United States Patent
Masuda et al.

(10) Patent No.: US 8,283,674 B2
(45) Date of Patent: Oct. 9, 2012

(54) SEMICONDUCTOR DEVICE WITH SILICON CARBIDE CHANNEL

(75) Inventors: Takeyoshi Masuda, Osaka (JP); Shinji Matsukawa, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 427 days.

(21) Appl. No.: 12/158,382

(22) PCT Filed: Oct. 26, 2006

(86) PCT No.: PCT/JP2006/321370
§ 371 (c)(1),
(2), (4) Date: Jun. 20, 2008

(87) PCT Pub. No.: WO2007/125617
PCT Pub. Date: Nov. 8, 2007

(65) Prior Publication Data
US 2009/0230404 A1 Sep. 17, 2009

(30) Foreign Application Priority Data
Apr. 28, 2006 (JP) .................. 2006-126432

(51) Int. Cl.
*H01L 29/15* (2006.01)
(52) U.S. Cl. .................. 257/77; 257/E29.118; 438/105; 438/931
(58) Field of Classification Search .................. 257/77
See application file for complete search history.

(56) References Cited

U.S. PATENT DOCUMENTS

| 6,097,039 | A | 8/2000 | Peters et al. |
|---|---|---|---|
| 6,573,534 | B1 * | 6/2003 | Kumar et al. .................. 257/77 |
| 7,045,879 | B2 | 5/2006 | Hisada et al. |
| 2004/0159841 | A1 | 8/2004 | Hisada et al. |
| 2005/0230686 | A1 | 10/2005 | Kojima et al. |
| 2006/0220026 | A1 | 10/2006 | Uchida et al. |
| 2007/0176230 | A1 | 8/2007 | Uchida et al. |

FOREIGN PATENT DOCUMENTS

| EP | 0962963 | 12/1999 |
|---|---|---|
| EP | 1065726 | 1/2001 |
| JP | 05-347410 | 12/1993 |
| JP | 11-16840 | 1/1999 |
| JP | 11-097688 | 4/1999 |

(Continued)

OTHER PUBLICATIONS

Starke et al., "SiC Surface Reconstruction: Relevancy of Atomic Structure for Growth Technology," Surface Review and Letters, 6(6):1129-1141 (1999).

*Primary Examiner* — Ajay K Arora
(74) *Attorney, Agent, or Firm* — Fish & Richardson P.C.

(57) ABSTRACT

MOSFET is provided with SiC film. SiC film has a facet on its surface, and the length of one period of the facet is 100 nm or more, and the facet is used as channel. Further, a manufacturing method of MOSFET includes: a step of forming SiC film; a heat treatment step of heat-treating SiC film in a state where Si is supplied on the surface of SiC film; and a step of forming the facet obtained on the surface of SiC film by the heat treatment step into a channel. Thereby, it is possible to sufficiently improve the characteristics.

2 Claims, 9 Drawing Sheets

FOREIGN PATENT DOCUMENTS

| | | |
|---|---|---|
| JP | 2000-294777 | 10/2000 |
| JP | 2001-517375 | 2/2001 |
| JP | 2002-261275 | 9/2002 |
| JP | 2003-318409 | 11/2003 |
| JP | 2004-207511 | 7/2004 |
| JP | 2005-019951 | 1/2005 |
| JP | 2006-13005 | 1/2006 |
| WO | 2005/053034 | 6/2005 |

* cited by examiner

SEMICONDUCTOR DEVICE WITH SILICON CARBIDE CHANNEL

TECHNICAL FIELD

The present invention relates to a semiconductor device and a manufacturing method therefor, and more particularly to a semiconductor device provided with a film made of silicon carbide (hereinafter abbreviated as SiC) and a manufacturing method of the device.

BACKGROUND ART

SiC has a wide band gap and a maximum insulation electric field one order of magnitude higher than that of silicon (hereinafter abbreviated as Si), and hence is expected to be applied to a next generation power semiconductor element. SiC is used for various electronic devices by using single crystal wafers referred to as 4H-SiC or 6H-SiC, and is considered to be particularly suitable for a high temperature and high power semiconductor element. Each of the above described crystals is an alpha phase SiC formed by laminating a sphalerite type crystal and a wurtzite type crystal. In addition, a prototypic semiconductor is also manufactured by using a beta phase SiC referred to as 3C-SiC. Recently, a Schottky diode, a MOSFET (metal oxide semiconductor field-effect transistor), a thyristor and the like are trially manufactured as the power semiconductor element. It is confirmed that such prototype elements exhibit extremely excellent characteristics as compared with conventional Si semiconductor devices.

In the semiconductor device using SiC, especially in a MOSFET having a channel formed on a surface of a SiC substrate, the surface formed by high temperature annealing is conventionally used as the channel. However, irregular recessions and projections exist on the surface of the SIC substrate obtained by the high temperature annealing. For this reason, the interface state density is increased, to thereby cause carrier mobility to be reduced, which results in a problem that the characteristics of the semiconductor device is deteriorated.

A technique for making it possible to solve this problem to a certain degree is disclosed in, for example, Japanese Patent Laying-Open No. 2000-294777 (Patent Document 1). In the above described Patent Document 1, a flat part (terrace surface) between bunching steps produced at the time of annealing after ion implantation is used for the channel part of a field-effect transistor, such as a MOSFET. Specifically, a SiC substrate is annealed at a temperature of 1600° C. in an atmosphere of Ar (argon) for one hour. As a result, steps are formed to gather each other on the surface of the SiC substrate, so that bunching steps are formed to make a flat part formed between the bunching steps. This flat part is used as the channel part of the MOSFET.

Patent Document 1: Japanese Patent Laying-Open No. 2000-294777

DISCLOSURE OF THE INVENTION

Problems to be Solved by the Invention

However, a number of recessions and projections still exist on the surface of the SiC substrate obtained by the method disclosed in Patent Document 1, which makes it impossible to sufficiently improve the characteristics of the semiconductor device. This is because of the following reasons.

In the annealing process after the ion implantation, desorption and adsorption of Si atoms and C (carbon) atoms are repeated, so that the bunching steps are formed due to the anisotropy of the resultant crystal. For this reason, the damage of the SiC substrate surface by the ion implantation cannot be sufficiently recovered only by the annealing, and hence the recessions and projections still exist on the surface.

Further, the bunching steps obtained by the annealing are formed by the reconstitution of steps, and hence are steps of a level of several atomic layers. For this reason, the length of the flat part between bunching steps (in other words, the length of one period of the bunching step) is about 10 nm and extremely short. Even when the bunching steps having such length are used for the channel part, it is not possible to improve the carrier mobility. Rather, there is a possibility that the carrier mobility is reduced due to the influence of carrier scattering.

Accordingly, an object of the invention is to provide a semiconductor device whose characteristics can be sufficiently improved, and a method for manufacturing the semiconductor device.

Means for Solving the Problems

A semiconductor device according to the present invention includes a semiconductor film made of silicon carbide (SiC). The semiconductor film has a facet on its surface, and uses the facet as a channel.

According to the semiconductor device of the present invention, since the length of the flat part of the facet is longer than the length of the flat part of the bunching step, it is possible to reduce the interface state density and improve the carrier mobility, as a result of which the characteristics of the semiconductor device can be sufficiently improved.

In the semiconductor device according to the present invention, at least one of the facets is preferably constituted by {0001} face.

In a semiconductor film made of SiC, {0001} face is a surface on which only one of Si and C is exposed, and which is stable in terms of energy. Therefore, by constituting the facet by this surface, it is possible to reduce the interface state density, and to further reduce the carrier mobility.

In the semiconductor device according to the present invention, the semiconductor film preferably has a 4H-type crystal structure, and at least one of the facets is constituted by {03-38} face.

In the case where the semiconductor film made of SiC has the 4H-type crystal structure, {03-38} face is a surface on which only one of Si or C is exposed, and which is stable in terms of energy. Therefore, by constituting the facet by this surface, it is possible to reduce the interface state density, and to further reduce the carrier mobility.

In the semiconductor device according to the present invention, the semiconductor film preferably has a 6H-type crystal structure, and at least one of the facets is constituted by {01-14} face.

In the case where the semiconductor film made of SiC has the 6H-type crystal structure, {01-14} face is a surface on which only one of Si or C is exposed, and which is stable in terms of energy. Therefore, by constituting the facet by this surface, it is possible to reduce the interface state density, and to further reduce the carrier mobility.

In the semiconductor device according to the present invention, a channel is preferably included within the surface constituting the facet.

Thus, since the recessions and projections are very small within the surface constituting the facet, it is possible to extremely reduce the interface state density, and to improve the carrier mobility.

Preferably, in the semiconductor device according to the present invention, the semiconductor film is further provided with a groove on its surface, and a facet is formed adjacently to the groove.

The provision of the groove promotes the growth of the facet in the position adjacent to the groove. As a result, the facet having a large area can be formed in a desired position.

A manufacturing method of a semiconductor device according to the present invention, includes: a step of forming a semiconductor film made of SiC; a heat treatment step of heat-treating the semiconductor film in a state where Si is supplied on the surface of the semiconductor film; and a step of forming a facet obtained on the surface of the semiconductor film by the heat treatment step into a channel.

According to the manufacturing method of the semiconductor device of the present invention, it is possible that the semiconductor film made of SiC is reconstituted to have a stable surface state in terms of energy by heat-treating the semiconductor film made of SiC in the state where Si is supplied. As a result, a facet having the length of one period of 100 nm or more is obtained, and the length of the flat part of the facet can be made longer as compared with the conventional ones. Therefore, it is possible to improve the carrier mobility by reducing the interface state density, and to thereby sufficiently improve the characteristics of the semiconductor device.

Note that according to the above described manufacturing method, a facet having the length of one period of up to 2000 nm can be formed.

Preferably, the above described manufacturing method further include a step of flattening the surface of the semiconductor film before the heat treatment step.

Thereby, the semiconductor film made of SiC is uniformly reconstituted so as to make a facet grow in a large area.

Preferably, the above described manufacturing method further includes a step of forming a groove on the surface of the semiconductor film before the heat treatment step. In the heat treatment step, a facet is formed adjacently to the groove.

By forming the groove, the growth of the facet in the position adjacent to the groove is promoted. As a result, the facet having a large area can be formed in a desired position.

Preferably, in the above described manufacturing method, the heat treatment step includes a film coating step of forming a coating film, which contains Si as a main constituent element, on the surface of the semiconductor film made of SiC.

Thus, the state where Si is supplied on the surface of the semiconductor film made of SiC can be realized by the above described coating film. The growth of the semiconductor film in the direction perpendicular to the terrace surface is suppressed at positions on the semiconductor film where the coating film is formed, so that the reconstitution of the semiconductor film along the terrace surface can be promoted.

Preferably, in the above described manufacturing method, the channel forming step includes a step of oxidizing the coating film.

This enables the oxidized coating film to be utilized as a gate oxide film, so that the manufacturing process can be simplified as compared with the case where the coating film is removed and another gate oxide film is formed.

Preferably, the above described manufacturing method further includes a step of implanting impurities into the semiconductor film made of SiC and an activating step of activating the impurities. The heat treatment step and the activating step are performed in one and the same step.

Thereby, an impurity region having high carrier concentration is formed in the semiconductor film, so that the contact resistance between an electrode and the semiconductor film can be reduced. Further, the manufacturing process can be simplified as compared with the case where impurities are activated by a separated step.

EFFECTS OF THE INVENTION

According to the semiconductor device of the present invention, and the manufacturing method of the semiconductor device, it is possible to sufficiently improve the characteristics of the semiconductor device.

DESCRIPTION OF THE REFERENCE SIGNS 1, 1b, 1c, 1d Facet, 2, 2a-2c, 3, 3a-3c Crystal face, 5a-5d Atom, 6a-6c Straight line, 7 Bunching step, 10 SiC substrate, 11 SiC film, 11a Facet forming layer, 12a, 12b N-type contact area, 13, 13a Insulating film, 14a, 14b Hole, 16 Channel, 17 Source electrode, 18 Gate electrode, 19 Drain electrode, 20 Coating film, 23 Resist, 24 Resist carbonized cap, 25a, 25b Trench, 30, 30a, 30b MOSFET

BEST MODES FOR CARRYING OUT THE INVENTION

In the following, embodiments according to the present invention will be described with reference to the accompanying drawings. Note that in the following drawings, identical or corresponding parts are provided with the same reference numerals, and the explanation of such parts is not repeated. Further, in this specification, an individual orientation is represented by [ ], an aggregate orientation is represented by < >, an individual face is represented by ( ), and an aggregate surface is represented by { }, respectively. Further, a negative index is crystallographically represented by "-" (bar) attached on a numeric character, but in this specification, is represented by a negative sign attached to the position before the numeric character.

Embodiment 1

Figure 1:
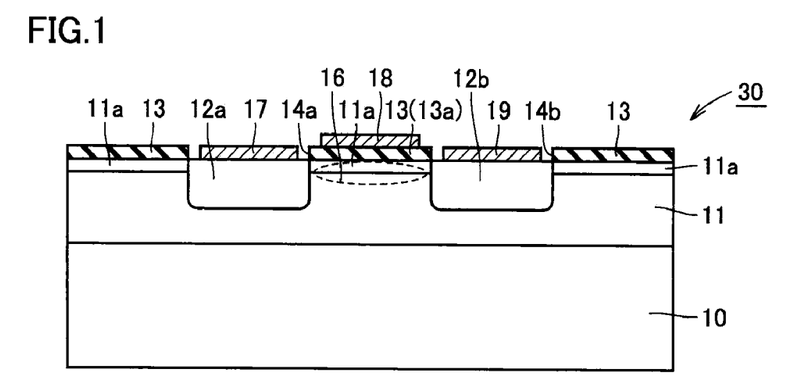
FIG. 1 is a sectional view showing a constitution of a MOSFET according to an embodiment 1 of the present invention.

FIG. 1 is a sectional view showing a constitution of a MOSFET according to an embodiment 1 of the present invention. Referring to FIG. 1, a MOSFET 30 as a semiconductor device includes a SiC substrate 10 and a p-type SiC film 11 as a semiconductor film made of SiC. The SiC crystal constituting SiC substrate 10 is formed in such a manner that, for example, (0001) face is inclined by 8° relative to the [11-20] direction (that is, has an off angle of 8°), or has an off angle of 8° relative to the [1-100] direction. SiC film 11 is a film homoepitaxially grown on SiC substrate 10, to succeed the crystal structure of SiC substrate 10, SiC film 11 has a facet forming layer 11a on its surface. Note that in FIG. 1, a boundary line is drawn between SiC film 11 and facet forming layer 11a for convenience of explanation, but such boundary line does not exist actually and the facet is formed on the surface of SiC film 11.

Figure 2:
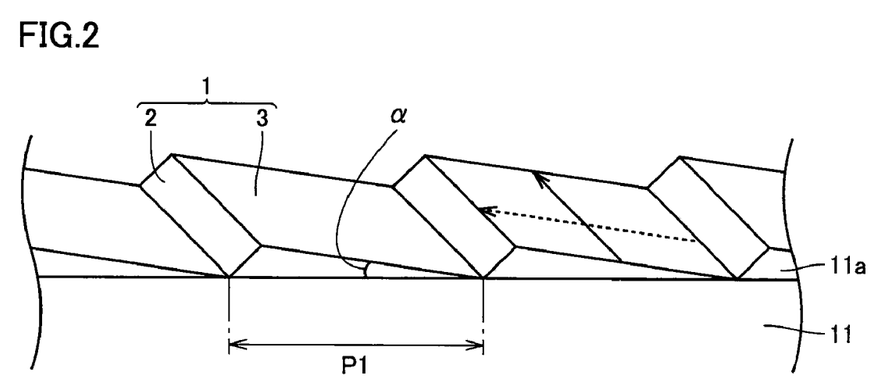
FIG. 2 is an enlarged perspective view showing a facet forming layer in FIG. 1.

FIG. 2 is an enlarged perspective view showing the facet forming layer in FIG. 1. Referring to FIG. 2, from a microscopic viewpoint, the surface of SiC film 11 is not flat and has recessions and projections, and a plurality of facets 1 are formed on facet forming layer 11a. Each of facet 1 is constituted by a crystal face 2 and a crystal face 3. The length P1 of one period of facet 1 is 100 nm or more. Here, the length of one period of facet 1 is the length obtained by adding the lengths of crystal face 2 and crystal face 3 which constitute one facet 1, in the direction (lateral direction in FIG. 2) along the surface of SiC film 11 from a macroscopic viewpoint. In the case where SiC film 11 has a 4H-type crystal structure, crystal face 2 is, for example, (0001) face, and crystal face 3 is, for example, (11-2n) face (where n is an arbitrary integer) or (03-38) face. That is, the inclination angle of crystal face 3 with respect to the horizontal direction in FIG. 2 is the off angle α of SiC film 11.

Figure 3A:
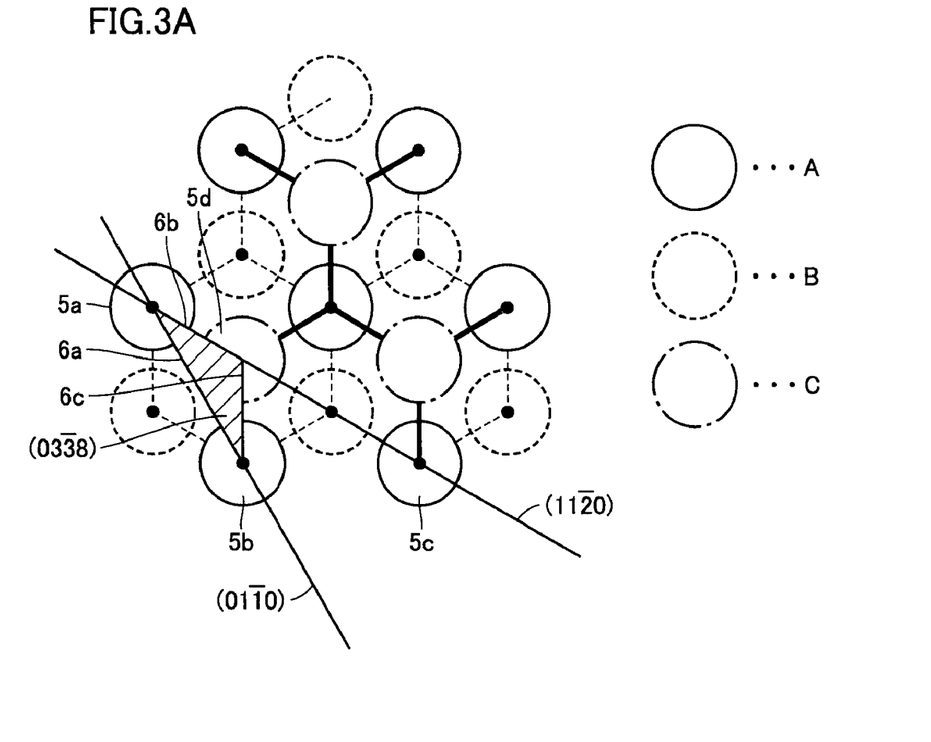
FIG. 3A is a figure showing a crystal structure of (0001) face of a 4H-type SiC crystal.
Figure 3B:
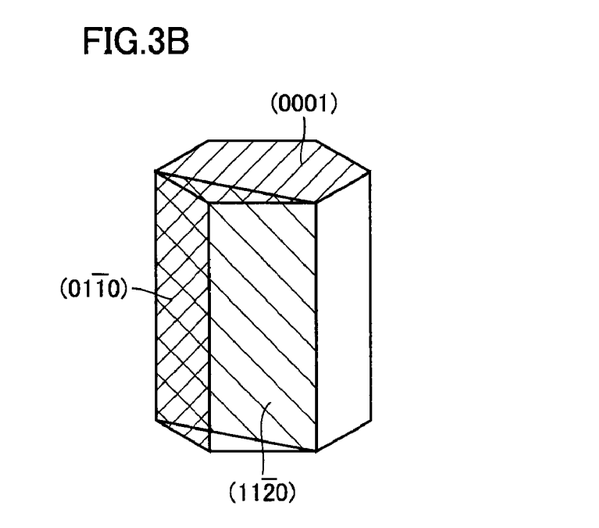
FIG. 3B is a figure for explaining (01-10) face and (11-20) face of the SiC crystal.

Here, (0001) face and (03-38) face of the 4H-type SiC crystal are explained. FIG. 3A is a figure showing a crystal structure of (0001) face of the 4H-type SiC crystal, and FIG. 3B is a figure for explaining (01-10) face and (11-20) face of the SiC crystal.

Referring to FIG. 3A, (0001) face of the 4H-type SiC crystal is a surface corresponding to the upper surface of a hexagonal column, and a layer A having an atomic arrangement expressed by "A" is the uppermost layer. In the 4H-type SiC crystal, a layer A having an atomic arrangement represented by "A", a layer B having an atomic arrangement represented by "B", and a layer C having an atomic arrangement represented by "C" are laminated in a laminating order of ABCBCA - - - , in the [0001] direction (the direction perpendicular to the paper surface). In (0001) face, arbitrary two atoms adjacent to each other among six atoms arranged at positions of the vertexes of the regular hexagon are defined as atoms 5a and 5b, and a straight line connecting these atoms 5a and 5b is defined as a straight line 6a. Further, in layer B adjacent to layer A in the [0001] direction, an atom at a position between atom 5a and atom 5b in the direction away from (0001) face, is defined as an atom 5d, and a straight line connecting atom 5a and atom 5d is defined as a straight line 6b. Further, a straight line connecting atom 5b and atom 5d is defined as a straight line 6c. A plane including the triangle constituted by the above three straight lines 6a to 6c is (03-38) face. Note that referring to FIG. 3A and FIG. 3B, when another atom adjacent to atom 5b among six atoms arranged at positions of the vertexes of the regular hexagon is defined as an atom 5c, a surface extending in the [0001] directions through atoms 5a and 5c is (11-20) face, and a surface extending in the [0001] directions through atoms 5b and 5a is (01-10) face.

Further, SiC film 11 may have a 6H-type crystal structure. Referring to FIG. 3A, in the 6H-type SiC crystal, a layer A having an atomic arrangement represented by "A", a layer B having an atomic arrangement represented by "B", and a layer C having an atomic arrangement represented by "C" are laminated in the laminating order of ABCACBA - - - , in the [0001] direction. In this case, crystal face 2 is, for example, (0001) face and crystal face 3 is, for example, (01-14) face.

Note that in the case where SiC film 11 having the 4H-type crystal structure is formed, an off angle of the SiC crystal constituting SiC substrate 10 (an angle between the normal of the main surface of SiC substrate 10 and the normal of (0001) face), is preferably set to an angle from 0 degree to 55 degrees. Since (03-38) face is inclined by 55 degrees with respect to (0001) face, it is possible to obtain (0001) face or (03-38) face as a large surface of a facet (crystal face 3) by setting the off angle to 55 degrees or less. Further, the off angle is preferably set in a range from 0 degree to 1 degree, or from 1 degree to 10 degrees. By setting the off angle in the range from 0 degree to 1 degree, it is possible to obtain a SiC crystal having a large terrace. By setting the off angle in the range from 1 degree to 10 degrees, it is possible to easily epitaxially grow the SiC crystal. In the case where the off angle is set in the range from 0 degree to 10 degrees, it is possible to obtain (0001) face as a large surface of a facet.

Further, in the case where SiC film 11 having the 6H-type crystal structure is formed, an off angle of the SiC crystal constituting SiC substrate 10 (an angle between the normal of the main surface of SiC substrate 10 and the normal of (0001) face), is preferably set in a range from 0 degree to 55 degrees. Since (01-14) face is inclined by 55 degrees with respect to (0001) face, it is possible to obtain (0001) face or (01-14) face as a large surface of a facet (crystal face 3), by setting the off angle in a range 55 degrees or less. Further, the off angle is preferably set in a range from 0 degree to 1 degree, or from 1 degree to 10 degrees. By setting the off angle in the range from 0 degree to 1 degree, it is possible to obtain a SiC crystal having a large terrace. By setting the off angle in the range from 1 degree to 10 degrees, it is possible to easily epitaxially grow the SiC crystal. In the case where the off angle is set in the range from 0 degree to 10 degrees, it is possible to obtain (0001) face as a large surface of a facet.

Subsequently, a structure of MOSFET 30 according to the present embodiment is explained in detail. Referring to FIG. 1, MOSFET 30 is further includes n-type contact areas 12a and 12b, an insulating film 13, a source electrode 17, a gate electrode 18, and a drain electrode 19. N-type contact areas 12a and 12b are formed on the surface of SiC film 11. Insulating film 13 is formed on SiC film 11. Holes 14a and 14b are formed in insulating film 13, respectively, and n-type contact areas 12a and 12b are formed on the surface of SiC film 11 exposed at the bottom of holes 14a and 14b. Source electrode 17 is formed on the surface of n-type contact area 12a, and drain electrode 19 is formed on the surface of n-type contact area 12b. Here, n-type contact areas 12a and 12b are formed at parts where source electrode 17 and drain electrode 19 are in contact with SiC film 11, which makes it possible to reduce the contact resistance of source electrode 17 and drain electrode 19 with SiC film 11. Further, gate electrode 18 is formed on an insulating film 13a at a part between source electrode 17 and drain electrode 19. This makes insulating film 13a serve as a gate insulating film of MOSFET 30, and facet forming layer 11a existing just beneath insulating film 13a serves as a channel 16 of MOSFET 30.

MOSFET 30 accumulates electrons in channel 16 according to a voltage applied to gate electrode 18, thereby enabling current to flow between source electrode 17 and drain electrode 19. In the present embodiment, MOSFET 30 is of a horizontal type, and hence the current between source electrode 17 and drain electrode 19 flows almost in parallel to the surface of SiC film 11.

Subsequently, a manufacturing method of MOSFET 30 according to the present embodiment is explained with reference to FIGS. 4 to 12.

Figure 4:
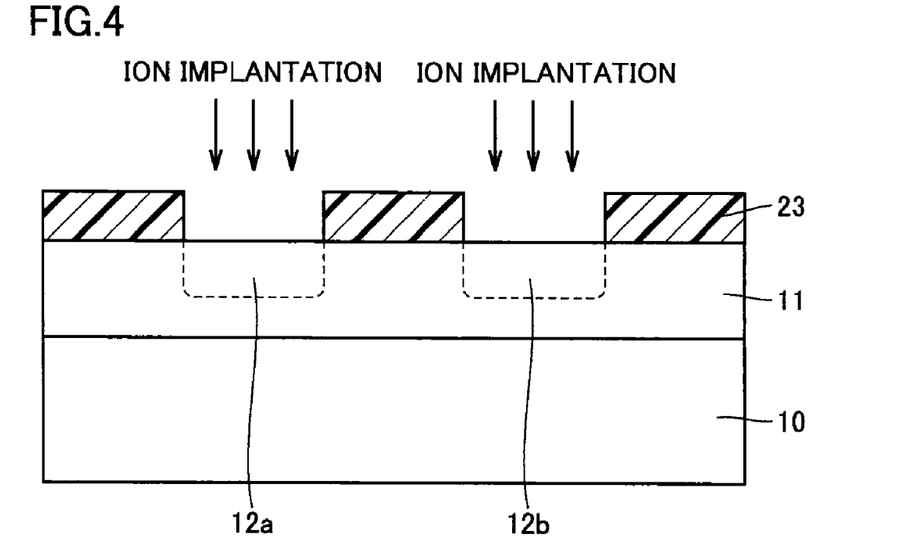
FIG. 4 is a sectional view showing a first step of a manufacturing method of the MOSFET according to embodiment 1 of the present invention.

Referring to FIG. 4, SiC film 11 is first epitaxially grown on SiC substrate 10. At this time, a number of irregular recessions and projections (steps) exist on the surface of SiC film 11. Subsequently, a resist 23 having a specified shape is formed on SiC film 11, and impurities, such as for example N (nitrogen), are ion-implanted to SiC film 11 by using resist 23 as a mask. Thereby, impurities are implanted to the parts serving as n-type contact areas 12a and 12b.

Figure 5:
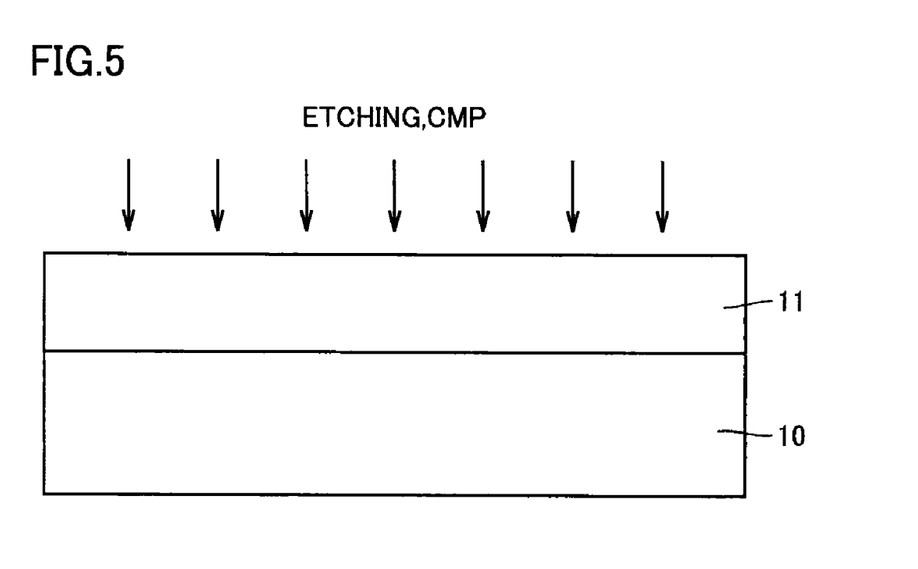
FIG. 5 is a sectional view showing a second step of the manufacturing method of the MOSFET according to embodiment 1 of the present invention.

Next, referring to FIG. 5, resist 23 is removed and the surface of SiC film 11 is flattened. Specifically, the whole surface of SiC film 11 is subjected to etching using HCl (hydrogen chloride) Or $H_2$ (hydrogen), or reactive ion etching. Alternatively, the whole surface of SiC film 11 may be ground by CMP (Chemical Mechanical Polish). Thereby, the recessions and projections and a damage due to the ion implantation, which exist on the surface of SiC film 11, are removed, and the surface of SiC film 11 is flattened.

Figure 6:
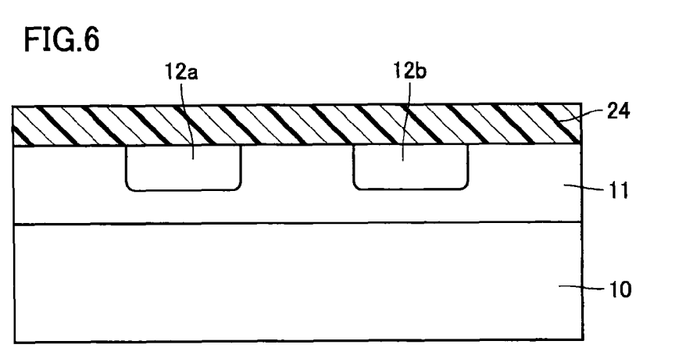
FIG. 6 is a sectional view showing a third step of the manufacturing method of the MOSFET according to embodiment 1 of the present invention.

Next, referring to FIG. 6, a resist carbonized cap 24 is formed so as to cover SiC film 11. Subsequently, SiC film 11 is heat-treated, for example, at a temperature of 1700° C. Thereby, the impurities are activated and n-type contact areas 12a and 12b are formed. Further, due to the heat treatment of SiC film 11, the steps on the surface of SiC film 11 gather each other, so that a number of bunching steps 7 (FIG. 8) are formed on the surface of SiC film 11.

Figure 7:
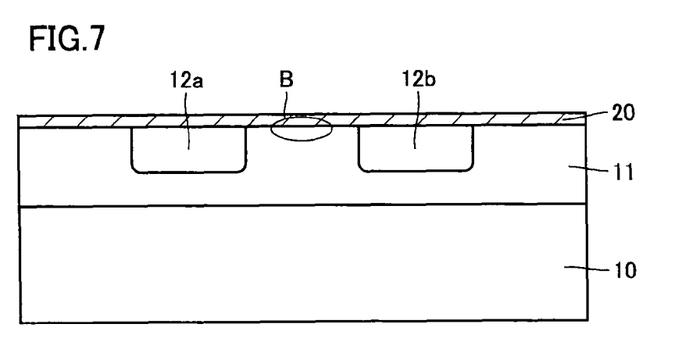
FIG. 7 is a sectional view showing a fourth step of the manufacturing method of the MOSFET according to embodiment 1 of the present invention.

Next, referring to FIG. 7, resist carbonized cap 24 is removed and a coating film 20 made of Si is formed so as to cover SiC film 11. Thereby, a state where Si is supplied on the surface of SiC film 11 is effected. Subsequently, SiC film 11 is heat-treated, for example, at a temperature of about 1500° C. Thereby, the surface of SiC film 11 is reconstituted, and facet forming layer 11a is formed on the surface of SiC film 11.

Note that in the above description, a case where SiC film 11 is heat-treated at a temperature of 1500° C., but the heat treatment temperature of SiC film 11 is preferably set in the following ranges. In order to prevent SiC from being sublimated and completely decomposed, the heat treatment temperature is preferably set to 2545° C. or less. Further, in order to prevent SiC from being sublimated in a state of $SiC_2$, Si, $Si_2C$ or the like to some degrees, the heat treatment temperature is preferably set to 2000° C. or less. Further, in order to sufficiently prevent SiC from being sublimated in a state of $SiC_2$, Si, $Si_2C$ or the like and to facilitate control of the surface morphology of SiC film 11, the heat treatment temperature is preferably set to 1800° C. or less. Further, in order to secure the good surface morphology of SiC film 11, the heat treatment temperature is preferably set to 1600° C. or less. On the other hand, in order to enable SiC to grow and to promote the formation of facets, the heat treatment temperature is preferably set to 1300° C. or more. Further, in order to secure the good surface morphology of SiC film 11, the heat treatment temperature is preferably set to 1400° C. or more.

Further, the heat treatment time of SiC film 11 may be a time period longer than 0, and is preferably set to the following ranges. In order to form a comparatively large facet, the heat treatment time is preferably set to 10 minutes or more. In order to form a facet, the length of one period of which is 0.5 μm or more, the heat treatment time is preferably set to 30 minutes or more. On the other hand, in consideration of the productivity of the semiconductor device, the heat treatment time is preferably set to 4 hours or less. In order to efficiently form a facet, the length of one period of which is 1.0 μm or more, the heat treatment time is preferably set to 2 hours or less. Note that "heat treatment time" means a time period in which the SiC film is held at a predetermined temperature, and in which the temperature rise time and the temperature fall time are not included.

Figure 8:
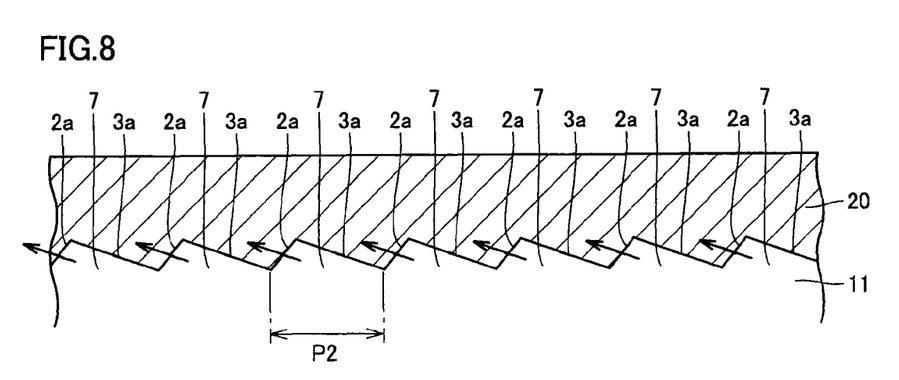
FIG. 8 is an enlarged view of the section B in FIG. 7, showing a first state where the facet forming layer is formed.
Figure 9:
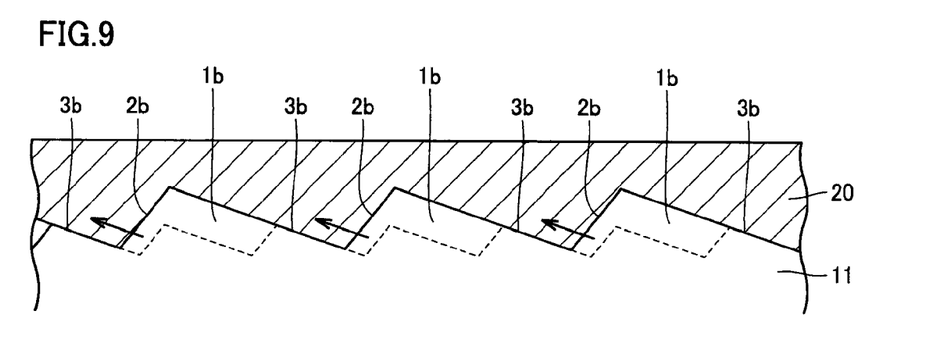
FIG. 9 is an enlarged view of the section B in FIG. 7, showing a second state where the facet forming layer is formed.
Figure 10:
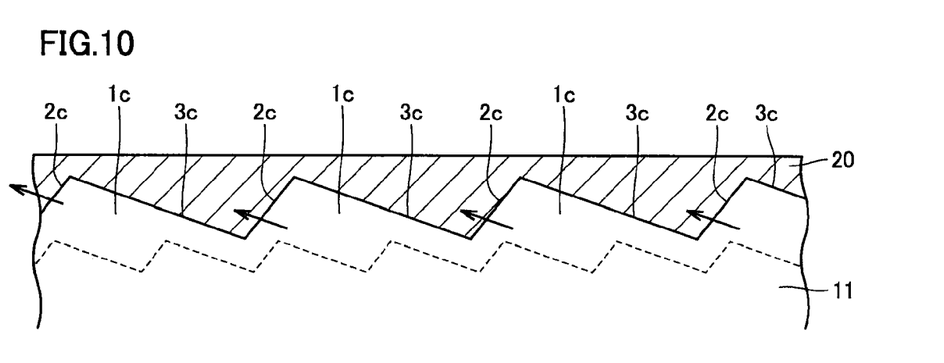
FIG. 10 is an enlarged view of the section B in FIG. 7, showing a third state where the facet forming layer is formed.

Here, a state that facet forming layer 11a is formed on the surface of SiC film 11 is explained with reference to FIG. 8 to FIG. 10. Note that FIG. 8 to FIG. 10 are enlarged views of the section B in FIG. 7. Referring to FIG. 8, a number of bunching steps 7 exist on the surface of SiC film 11 before heat treatment. Each of bunching step 7 is constituted by a crystal face 2a and a crystal face 3a. Crystal face 3a has a flat part longer than that of crystal face 2a, and serves as a terrace surface of bunching step 7. A lateral length P2 of crystal face 3a in bunching step 7 in the figure is about 10 nm. When SiC film 11 is heat-treated in a state where Si is supplied on the surface of SiC film 11, SiC film 11 does not grow in the direction perpendicular to crystal face 3a, and as indicated by the arrow in FIG. 8, SiC film 11 grows in the direction along crystal face 3a from crystal face 2a as a starting point. As a result, respective bunching steps 7 gather each other, so that as shown in FIG. 9, a facet 1b having a crystal face 3b larger than crystal face 3a of bunching step 7 is formed. Facet 1b further grows in the direction along crystal face 3b from a crystal face 2b as a starting point. As a result, respective facets 1b gather each other, so that as shown in FIG. 10, a facet 1c having a crystal face 3c larger than crystal face 3b of facet 1b is formed. Facet 1c further grows in the direction along crystal face 3c from a crystal face 2c as a starting point. As a result, respective facets 1c gather each other, so that as shown in FIG. 2, facet 1 having crystal face 3 larger than crystal face 3c of facet 1c is formed. In this way, facet forming layer 11a is formed.

Note that in the present embodiment, a case where coating film 20 is formed, is described, but Si may be supplied on the surface of SiC film 11 by introducing Si based gas on the surface of SiC film 11, instead of forming coating film 20. Further, Si may be supplied on the surface of SiC film 11 by applying a liquid containing Si to the surface of SiC film 11.

Figure 11:
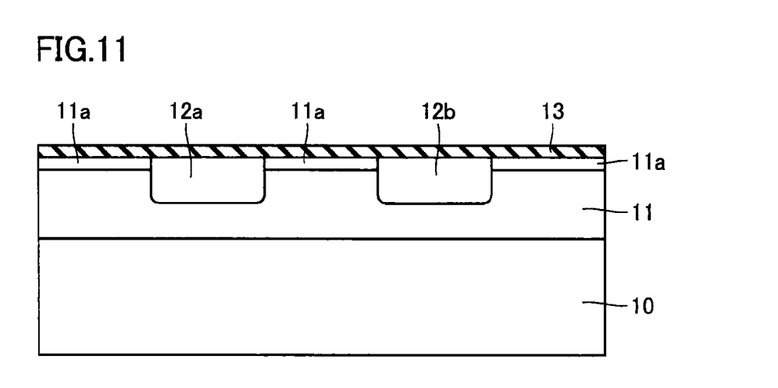
FIG. 11 is a sectional view showing a fifth step of the manufacturing method of the MOSFET according to embodiment 1 of the present invention.

Next, referring to FIG. 11, coating film 20 is removed, and insulating film 13 is formed so as to cover SiC film 11. Here, insulating film 13 may be formed by oxidizing coating film 20, without removing coating film 20.

Figure 12:
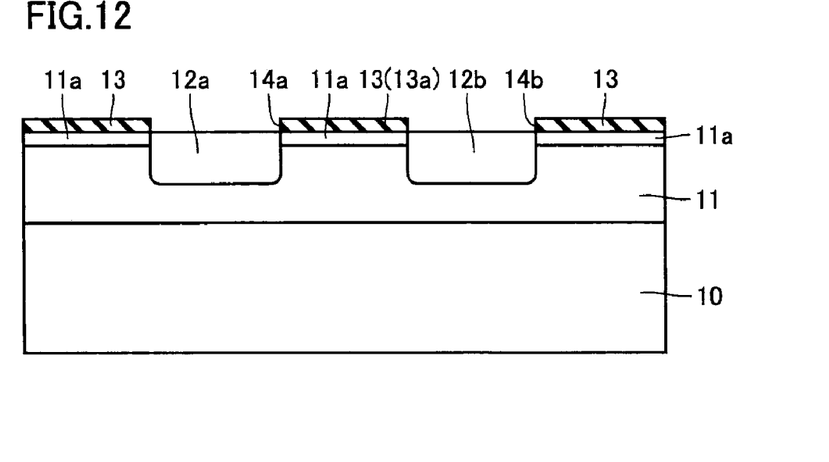
FIG. 12 is a sectional view showing a sixth step of the manufacturing method of the MOSFET according to embodiment 1 of the present invention.

Next, referring to FIG. 12, insulating film 13 is etched to open holes 14a and 14b in insulating film 13, so as to expose the parts where n-type contact areas 12a and 12b are formed on the surface of SiC film 11. Then, source electrode 17 and drain electrode 19 are formed on n-type contact areas 12a and 12b exposed at the bottom of holes 14a and 14b, respectively, and gate electrode 18 is formed on insulating film 13a between source electrode 17 and drain electrode 19. Thereby, facet forming layer 11a obtained on the surface of SiC film 11 is enabled to serve as channel 16. According to the above steps, MOSFET 30 shown in FIG. 2 is completed.

MOSFET 30 according to the present embodiment includes SiC film 11. SiC film 11 has facet forming layer 11a on its surface, and uses facet forming layer 11a as channel 16.

According to MOSFET 30 of the present embodiment, since the length of the flat part of facet 1 is longer than the length of the flat part of the bunching step, it is possible to reduce the interface state density and to improve the carrier mobility, as a result of which the characteristics of MOSFET can be sufficiently improved.

Preferably, in MOSFET 30 according to the present embodiment, at least one crystal face among facets 1 is constituted by (0001) face.

In the semiconductor film made of SiC, (0001) face is a face on which only one of Si and C is exposed, and which is stable in terms of energy. Therefore, by constituting facet 1 by this crystal face, it is possible to reduce the interface state density, and to further reduce the carrier mobility.

Preferably, in MOSFET 30 according to the present embodiment, SiC film 11 is has a 4H-type crystal structure, and facet 1 is constituted by (03-38) face.

Preferably, in MOSFET 30 according to the present embodiment, SiC film 11 is has a 6H-type crystal structure, and facet 1 is constituted by (01-14) face.

In the case where SiC film 11 has the 4H-type crystal structure, (03-38) face is a face on which only one of Si and C is exposed, and which is stable in terms of energy. Further, in the case where SiC film 11 has the 6H-type crystal structure, (01-14) face is a face on which only one of Si and C is exposed, and which is stable in terms of energy. Therefore, by constituting facet 1 by the crystal faces, it is possible to reduce the interface state density, and to further reduce the carrier mobility.

A manufacturing method of MOSFET 30 according to the present embodiment, includes: a step of forming SiC film 11; a heat treatment step of heat-treating SiC film 11 in a state where Si is supplied on the surface of SiC film 11; and a step of forming facet 1 obtained on the surface of SiC film 11 by the heat treatment step into channel 16.

According to the manufacturing method of MOSFET 30 of the present embodiment, it is possible to make SiC film 11 grow (reconstituted) in the direction along crystal face 3a of bunching step 7 by heat-treating SiC film 11 in the state where Si is supplied. As a result, facet 1 having the length of one period of 100 nm or more is obtained, and hence it is possible to make the length P1 of the flat part of facet 1 longer as compared with conventional ones. Therefore, the carrier mobility can be improved by reducing the interface state density, so that the characteristics of MOSFET 30 can be sufficiently improved.

Especially, it is possible to promote the growth of the facet at a low temperature of 1600° C. or less by supplying Si. For this reason, when Si is supplied by forming coating film 20 made of Si, it is possible to prevent Si from being sublimated.

Further, in the conventional manufacturing method, since the position in which the bunching step is formed is limited in the off direction of the substrate, it is not possible to form a channel in an arbitrary position on the surface of the SiC substrate. On the other hand, according to the manufacturing method of the present embodiment, it is possible to change the position in which facet 1 is formed, by the position to which Si is supplied, and to thereby form channel 16 in an arbitrary position.

In the above described manufacturing method, the surface of SiC film 11 is flattened before the heat treatment of SiC film 11. This enables SiC film 11 to be uniformly reconstituted, so as to make facet 1 grow in a large area.

In the above describe manufacturing method, when SiC film 11 is heat-treated, coating film 20 made of Si is formed on the surface of SiC film 11.

Thereby, a state where Si is supplied on the surface of SiC film 11 can be effected by coating film 20. In the part on SiC film 11 where coating film 20 is formed, the growth of SiC film 11 in the direction perpendicular to crystal face 3a is restricted, so that the reconstitution of SiC film 11 along crystal face 3a can be promoted.

Preferably, in the above described manufacturing method, channel 16 is formed by making coating film 20 oxidized and used as a gate insulating film.

Thereby, oxidized coating film 20 can be used as the gate oxide film, and hence the manufacturing process can be simplified as compared with the case where the coating film is removed, and another gate oxide film is formed.

Embodiment 2

In the present embodiment, a manufacturing method of MOSFET 30 shown in FIG. 1 other than the embodiment 1 is explained.

In the manufacturing method according to the present embodiment, first, manufacturing steps similar to those in embodiment 1 shown FIG. 4 to FIG. 5 are performed. Therefore, the explanation of the steps is omitted.

Figure 13:
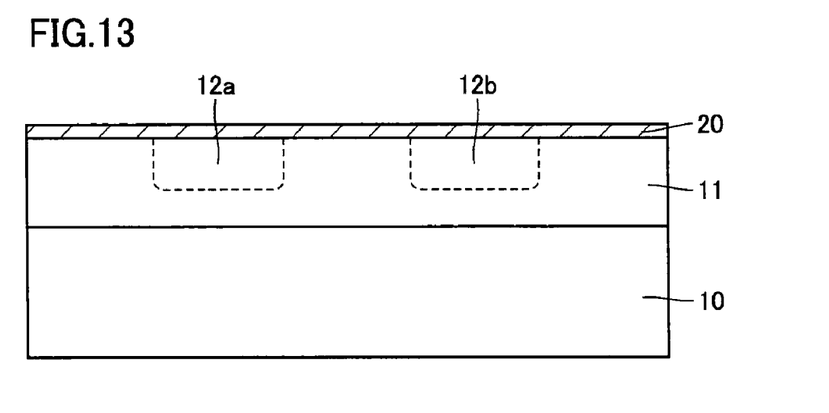
FIG. 13 is a sectional view showing a first step of a manufacturing method of a MOSFET according to an embodiment 2 of the present invention.

Next, referring to FIG. 13, coating film 20 made of Si is formed so as to cover SiC film 11. Thereby, a state where Si is supplied on the surface of SiC film 11 is effected.

Figure 14:
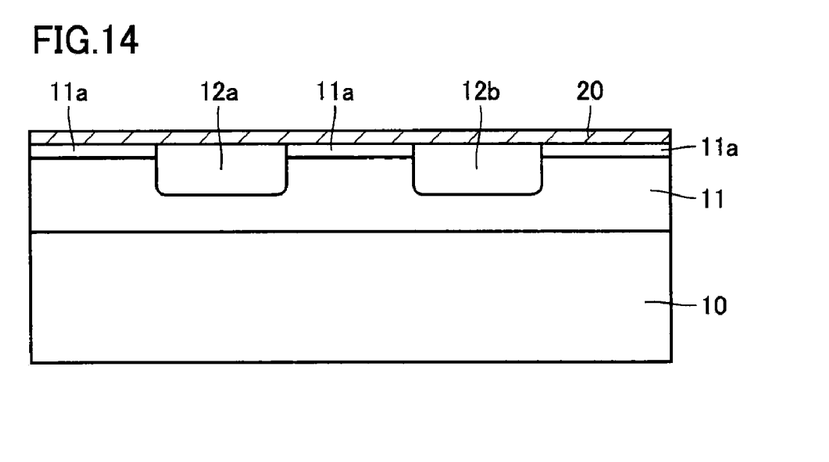
FIG. 14 is a sectional view showing a second step of the manufacturing method of the MOSFET according to embodiment 2 of the present invention.

Next, referring to FIG. 14, SiC film 11 is heat-treated at a temperature of, for example, about 1500° C. This heat treatment enables impurities to be activated, and n-type contact areas 12a and 12b to be formed. Further, this heat treatment enables the steps on the surface of SiC film 11 to gather each other, so as to make a number of bunching steps formed. Further, similarly to the case of the embodiment 1, SiC film 11 is enabled to grow (reconstructed) in the direction along the terrace surface of the bunching steps. As a result, impurities are activated, and at the same time, facet forming layer 11a constituted by a number of facets is formed on the surface of SiC film 11.

Thereafter, manufacturing steps similar to those in embodiment 1 shown in FIG. 11 and FIG. 12 are performed, so that MOSFET 30 shown in FIG. 1 is completed. The explanation about these manufacturing steps is omitted.

The manufacturing method of MOSFET 30 according to the present embodiment further includes: a step of implanting impurities into SiC film 11 and an activating step of activating the impurities. The heat treatment of SiC film 11 and the activation of the impurities are performed by one and the same step.

Thereby, n-type contact areas 12a and 12b having high carrier concentration are formed in SiC film 11, so that the contact resistance of source electrode 17 and drain electrode 19 with SiC film 11 can be reduced. Further, the manufacturing process can be simplified as compared with the case where impurities are activated by a separate step.

Embodiment 3

Figure 15:
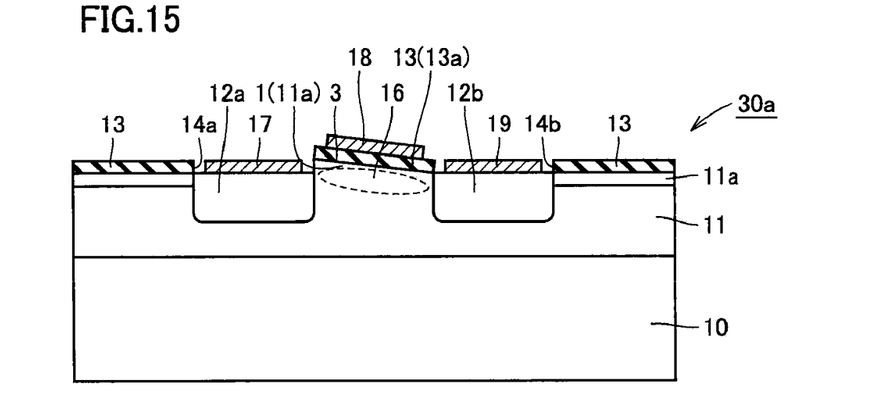
FIG. 15 is a sectional view showing a constitution of a MOSFET according to an embodiment 3 of the present invention.

In embodiment 1, there is shown a case where facet forming layer 11a serving as channel 16 is constituted by a plurality of facets 1, as shown in FIG. 1. However, according to the present invention, in addition to such case, for example, there may be a case where facet forming layer 11a serving as channel 16 of a MOSFET 30a is constituted by one facet 1, as shown in FIG. 15. In this case, gate electrode 18 and channel 16 are formed in parallel to crystal face 3 constituting facet 1, and channel 16 is included in crystal face 3. Thereby, recessions and projections are extremely reduced in crystal face 3 constituting facet 1, which makes it possible to significantly reduce the interface state density and to improve the carrier mobility.

Note that in the present embodiment, there is shown a case where the channel is extended within crystal face 3 in the direction parallel to the paper surface (direction indicated by the arrow of broken line in FIG. 2). However, in the present invention, in addition to such case, there may be a case where for example, the channel is extended within crystal face 3 in the direction perpendicular to the paper surface (direction indicated by the arrow of solid line in FIG. 2). Within crystal face 3, the channel can be extended in arbitrary direction.

Embodiment 4

Figure 16:
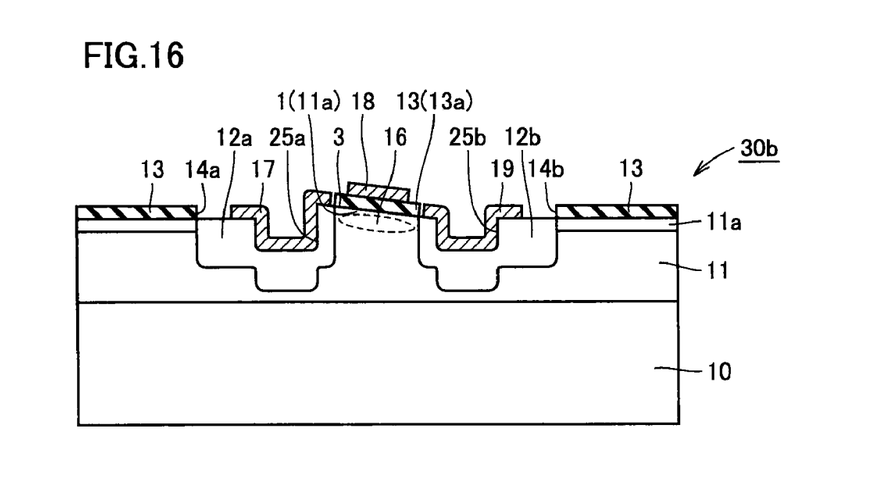
FIG. 16 is a sectional view showing a constitution of a MOSFET according to an embodiment 4 of the present invention.

FIG. 16 is a sectional view showing a constitution of a MOSFET according to an embodiment 4 of the present invention. Referring to FIG. 16, respective trenches (grooves) 25a and 25b are formed on the surface of SiC film 11 in a MOSFET 30b according to the present embodiment. Facet forming layer 11a serving as channel 16 is formed adjacently to both trenches 25a and 25b. Further, source electrode 17 and drain electrode 19 are formed so as to be along inner walls of trenches 25a and 25b, respectively.

Figure 17:
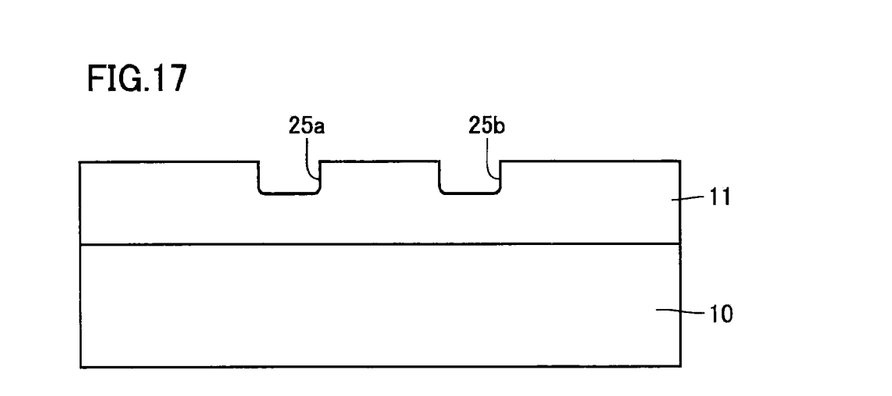
FIG. 17 is a sectional view showing a manufacturing method of the MOSFET according to embodiment 4 of the present invention.

Referring to FIG. 17, for example, after SiC film 11 is epitaxially grown, trenches 25a and 25b are formed by performing etching at predetermined positions on the surface of SiC film 11, respectively. Note that trenches 25a and 25b may be formed at least before facet forming layer 11a is formed by heat-treating SiC film 11.

Figure 18:
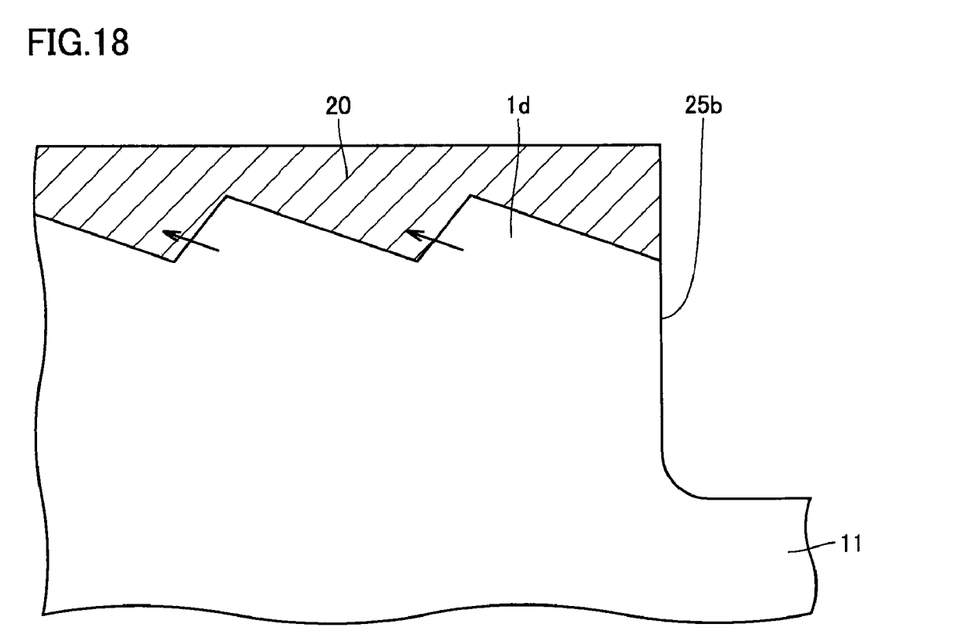
FIG. 18 is a figure for explaining the growth of a facet when a trench is formed.

It is possible to form the facet having a large area in a desired position by forming trenches 25a and 25b in this way. That is, when the facets grow, adjacent facets usually grow while giving their influences on each other. However, as shown in FIG. 18, when trench 25b is formed so as to be adjacent to an area where a facet is formed, there is no facet on the right side of a facet 1d, and hence facet 1d grows without being influenced by an adjacent facet. As a result, the growth of facet 1d is promoted so that a facet having a large area can be formed in the desired position.

Note that in embodiments 1 to 4, cases where facet forming layer 11a is formed on the surface of SiC film 11 formed on SiC substrate 10, are described, but the facet may also be formed on the surface of SiC substrate 10 in a state where SiC film 11 is not formed.

Further, in embodiments 1 to 4, cases where the crystal face is represented by an individual face such as (03-38) face and (01-14) face, are described, but similar effects can be obtained by aggregate faces equivalent to these individual faces, for example, {03-38} face in the case of (03-38) face, and {01-14} face in the case of (01-14) face.

Further, in embodiments 1 to 4, the case where MOSFET 30 is of a horizontal type, but a semiconductor device according to the present invention may also be a vertical type MOSFET. In this case, the MOSFET is constituted so that the drain electrode is formed on the surface of lower part of SiC substrate 10 in FIG. 1, and current between source electrode 17 and drain electrode 19 flows nearly perpendicularly to the surface of SiC film 11.

In the following, an example according to the present invention is described.

EXAMPLE 1

Figure 19:
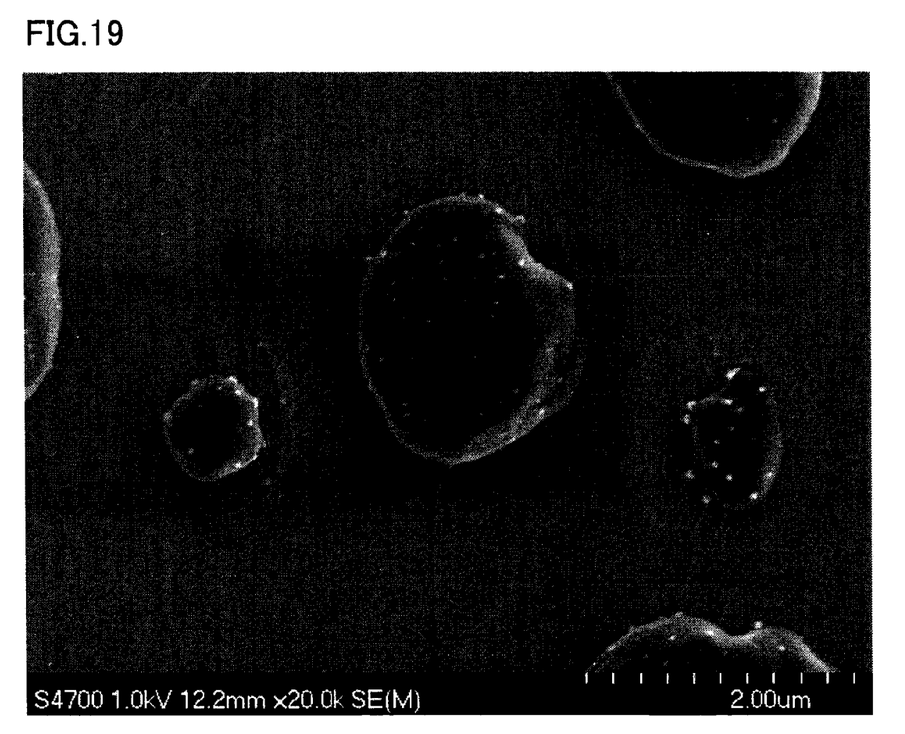
FIG. 19 is a photomicrograph showing the facet obtained by the manufacturing method according to the present invention.

The present inventors formed facets on the surface of a SiC film partially covered by a coating film made of Si by using the manufacturing method according to the present invention, and observed the surface of the SiC film. FIG. 19 is a photomicrograph showing the facet obtained by the manufacturing method according to the present invention. Referring to FIG. 19, the part indicated by C is a part where a coating film made of Si is formed, the part indicated by D is a facet, and the part indicated by E is a bunching step. Each of intervals between a plurality of lines extending in the longitudinal direction in the part indicated by E is the length of one period of the bunching step, and the length of one period of the bunching step is about 10 nm. On the other hand, the length of one period of the facet is 100 nm or more, and is longer than the length of one period of the bunching step. In view of the above, it can be seen that according to the manufacturing method of the present invention, it is possible to make the length of the flat part of the facet longer as compared with conventional ones.

It is to be understood that the embodiments and example as described above are to be regarded as illustrative in all aspects, and not as restrictive. The scope of the present invention is not limited to the above described embodiments and example, but is indicated by the claims, and all modifications and variations within the meaning and range of equivalents of the claims are intended to be within the scope of the present invention.

What is claimed is:
1. A semiconductor device comprising
a semiconductor film made of silicon carbide,
wherein the semiconductor film includes first and second grooves spaced apart from one another, and wherein a surface of the semiconductor film, which is disposed between the first and second grooves and extends from the first groove to the second groove, includes a facet, wherein each groove is U-shaped with a substantially flat bottom and substantially vertical sidewalls, wherein the facet serves as a channel and comprises a first crystal (0001) face and a second crystal (03-38) or (01-14) face, the second crystal face having a greater area than the first crystal face, wherein the channel is formed along the (03-38) or (01-14) face.
2. The semiconductor device according to claim 1, wherein the channel is included at a surface constituting the facet.

* * * * *